(12) United States Patent
Railkar et al.

(10) Patent No.: US 9,974,158 B2
(45) Date of Patent: *May 15, 2018

(54) AIR-CAVITY PACKAGE WITH TWO HEAT DISSIPATION INTERFACES

(71) Applicant: Qorvo US, Inc., Greensboro, NC (US)

(72) Inventors: Tarak A. Railkar, Plano, TX (US);
Kevin J. Anderson, Plano, TX (US);
Walid M. Meliane, Frisco, TX (US)

(73) Assignee: Qorvo US, Inc., Greensboro, NC (US)

( * ) Notice: Subject to any disclaimer, the term of this patent is extended or adjusted under 35 U.S.C. 154(b) by 0 days. days.

This patent is subject to a terminal disclaimer.

(21) Appl. No.: 15/410,081

(22) Filed: Jan. 19, 2017

(65) Prior Publication Data

US 2018/0063940 A1    Mar. 1, 2018

Related U.S. Application Data

(60) Provisional application No. 62/381,706, filed on Aug. 31, 2016.

(51) Int. Cl.
*H05K 1/02*     (2006.01)
*H05K 1/11*     (2006.01)
(Continued)

(52) U.S. Cl.
CPC .......... *H05K 1/0206* (2013.01); *H01L 21/50* (2013.01); *H01L 23/04* (2013.01); *H01L 23/10* (2013.01); *H01L 23/3675* (2013.01); *H01L 23/49822* (2013.01); *H01L 23/49827* (2013.01); *H01L 23/49838* (2013.01); *H01L 24/17* (2013.01); *H01L 24/48* (2013.01);
(Continued)

(58) Field of Classification Search
CPC . H01L 2924/01079; H01L 2924/01078; H01L 2924/01029; H01L 2924/01013; H01L 2924/15311
See application file for complete search history.

(56) References Cited

U.S. PATENT DOCUMENTS 8,451,618 B2    5/2013    Boeck et al.
8,742,569 B2    6/2014    Lo et al.
(Continued)

OTHER PUBLICATIONS

U.S. Appl. No. 15/409,885, filed Jan. 19, 2017.
(Continued)

*Primary Examiner* — Quoc Hoang
(74) *Attorney, Agent, or Firm* — Withrow & Terranova, P.L.L.C.

(57) ABSTRACT

The present disclosure relates to an air-cavity package, which includes a bottom substrate with a first heat dissipation interface, a top substrate with a second heat dissipation interface, a perimeter wall, a bottom electronic component, and a top electronic component. The perimeter wall extends between a periphery of the top substrate and a periphery of the bottom substrate to form a cavity. The bottom electronic component is mounted on the bottom substrate, exposed to the cavity, and thermally coupled to a bottom thermally conductive structure, which extends through the bottom substrate and towards the first heat dissipation interface. The top electronic component is mounted on the top substrate, exposed to the cavity, and thermally coupled to a top thermally conductive structure, which extends through the top substrate and towards the second heat dissipation interface.

21 Claims, 12 Drawing Sheets

(51) Int. Cl.

| | | |
|---|---|---|
| *H05K 1/18* | (2006.01) | |
| *H05K 3/30* | (2006.01) | |
| *H05K 3/46* | (2006.01) | |
| *H05K 1/14* | (2006.01) | |
| *H05K 3/36* | (2006.01) | |
| *H01L 23/367* | (2006.01) | |
| *H01L 23/498* | (2006.01) | |
| *H01L 25/065* | (2006.01) | |
| *H01L 25/16* | (2006.01) | |
| *H01L 23/00* | (2006.01) | |
| *H01L 23/04* | (2006.01) | |
| *H01L 23/10* | (2006.01) | |
| *H01L 25/00* | (2006.01) | |
| *H01L 21/50* | (2006.01) | |

(52) U.S. Cl.
CPC .......... *H01L 25/0655* (2013.01); *H01L 25/16* (2013.01); *H01L 25/50* (2013.01); *H05K 1/115* (2013.01); *H05K 1/144* (2013.01); *H05K 1/18* (2013.01); *H05K 3/30* (2013.01); *H05K 3/368* (2013.01); *H05K 3/4697* (2013.01); *H01L 2224/16113* (2013.01); *H01L 2224/16227* (2013.01); *H01L 2224/32225* (2013.01); *H01L 2224/48091* (2013.01); *H01L 2224/48106* (2013.01); *H01L 2224/48227* (2013.01); *H01L 2224/73203* (2013.01); *H01L 2224/73265* (2013.01); *H01L 2924/01029* (2013.01); *H01L 2924/15747* (2013.01); *H01L 2924/19041* (2013.01); *H01L 2924/19042* (2013.01); *H01L 2924/19043* (2013.01); *H01L 2924/19102* (2013.01); *H01L 2924/19105* (2013.01); *H05K 2201/042* (2013.01); *H05K 2201/1003* (2013.01); *H05K 2201/10015* (2013.01); *H05K 2201/10022* (2013.01); *H05K 2201/10522* (2013.01); *H05K 2201/10545* (2013.01); *H05K 2201/10674* (2013.01)

(56) References Cited

U.S. PATENT DOCUMENTS

| | | |
|---|---|---|
| 8,803,302 B2 | 8/2014 | Viswanathan et al. |
| 8,853,564 B2 | 10/2014 | Lo et al. |
| 8,907,467 B2 | 12/2014 | Komposch et al. |

OTHER PUBLICATIONS

U.S. Appl. No. 15/410,151, filed Jan. 19, 2017.
Author Unknown, "Subtron," Subtron Technology Co., Ltd, 2012, 2 pages, http://www.subtron.com.tw/.
Author Unknown, "Package on Package (PoP | PSfvBGA | PSfcCSP | TMV® PoP)," Amkor Technology, date accessed: Aug. 17, 2016, 5 pages, http://www.amkor.com/go/Package-on-Package.
Author Unknown, "Microcircuits: SD-18 Part Requirement & Application Guide," Naval Sea Systems Command, Warfare Centers, NSWC Crane Division, no date, accessed Aug. 17, 2016, http://www.naysea.navy.mil/Home/Warfare-Centers/NSWC-Crane/Resources/SD-18/Products/Microcircuits/Packaging.aspx, 9 pages.
Chin, Spencer, "Flexible BGA hurdles cost barrier," Electronic Products, Dec. 1, 1997, 4 pages, http://www.electronicproducts.com/Passive_Components/Flexible_BGA_hurdles_cost_barrier.aspx.
Author Unknown, "IC Packaging—Part I," National Museum of American History, Series 9, Integrated Circuit Engineering Collection, ICECAP Reports, Feb. 10,1982, 11 pages, http://smithsonianchips.si.edu/ice/package.htm.
Schueller, R. D. et al., "Performance and Reliability of a Cavity Down Tape BGA Package," 1997 IEEE/CPMT Electronic Packaging Technology Conference, 1997, IEEE, pp. 151-162.
Non-Final Office Action for U.S. Appl. No. 15/410,151, dated Oct. 20, 2017, 6 pages.
Notice of Allowance for U.S. Appl. No. 15/410,151, dated Nov. 20, 2017, 7 pages.
Non-Final Office Action for U.S. Appl. No. 15/409,885, dated Nov. 13, 2017, 6 pages.

AIR-CAVITY PACKAGE WITH TWO HEAT DISSIPATION INTERFACES

RELATED APPLICATIONS

This application claims the benefit of provisional patent application Ser. No. 62/381,706, filed Aug. 31, 2016, the disclosure of which is hereby incorporated herein by reference in its entirety.

FIELD OF THE DISCLOSURE

The present disclosure relates to an air-cavity package and a process for making the same, and more particularly to an air-cavity package with two heat dissipation interfaces, and a process to form the air-cavity package to provide two heat dissipation interfaces.

BACKGROUND

In semiconductor packaging, mold compounds are normally used to encapsulate flip-chip dies and or wire-bonding dies to protect the dies against damage from the outside environment. However, direct contact of the mold compounds and active die surfaces may adversely impact its electrical performance, especially for high frequency devices. Accordingly, it is desirable to package the dies in a configuration that is more appropriate for high frequency performance.

Because of their promise of lower cost and better performance, high levels of integration within semiconductor packages is highly desired. Package on package (POP), which stacks two or more semiconductor packages vertically, is a semiconductor packaging technology that allows higher electronics density in final products. POP offers benefits to small printed-circuit-board areas where short trace lengths between different semiconductor packages helps enhance device performance. However, for applications that have space constraints in the z-direction (thickness), POP may not provide an optimal package solution. Besides space savings considerations, the high levels of integration within semiconductor packages typically leads to a significant increase in the density of the heat flux, which increasingly requires specialized thermal management.

Accordingly, there remains a need for improved package configurations to increase the integration level of semiconductor packages and enhance the high frequency performance of the semiconductor packages without significantly increasing the package size. In addition, there is also a need to manage the increased heat generated in high performance packages.

SUMMARY

The present disclosure relates to an air-cavity package with two heat dissipation interfaces and a process for making the same. According to one embodiment, an air-cavity package includes a bottom substrate, a top substrate, a perimeter wall, a bottom electronic component, and a top electronic component. The bottom substrate includes a bottom substrate body having an upper side and a lower side, at least one bottom metal structure on the upper side of the bottom substrate body, and at least one bottom thermally conductive structure that extends from the upper side of the bottom substrate body through the bottom substrate body to the lower side of the bottom substrate body. The top substrate includes a top substrate body having an upper side and a lower side, at least one top metal structure on the lower side of the top substrate body, and at least one top thermally conductive structure that extends from the upper side of the top substrate body through the top substrate body to the lower side of the top substrate body. The perimeter wall extends from a periphery of the lower side of the top substrate body to a periphery of the upper side of the bottom substrate body. As such, a cavity is defined by a portion of the upper side of the bottom substrate body, an inside surface of the perimeter wall, and a portion of the lower side of the top substrate body. The perimeter wall includes at least one signal via structure that extends from an upper surface of the perimeter wall through the perimeter wall to a lower surface of the perimeter wall, and is electrically coupled to the at least one bottom metal structure and the at least one top metal structure. The bottom electronic component is mounted on the upper side of the bottom substrate body and exposed to the cavity. The top electronic component is mounted on the lower side of the top substrate body and exposed to the cavity. Herein, the at least one bottom thermally conductive structure is thermally coupled to the bottom electronic component and conducts heat generated from the bottom electronic component toward the lower side of the bottom substrate body. The at least one top thermally conductive structure is thermally coupled to the top electronic component and conducts heat generated from the top electronic component toward the upper side of the top substrate body.

In one embodiment of the air-cavity package, the bottom substrate further includes a bottom signal via extending from the upper side of the bottom substrate body through the bottom substrate body to the lower side of the bottom substrate body. The bottom signal via is electrically coupled to the at least one bottom metal structure and separated from the at least one bottom thermally conductive structure.

In one embodiment of the air-cavity package, the top substrate further includes a top metal layer over at least a portion of the upper side of the top substrate body and thermally coupled to the at least one top thermally conductive structure.

According to another embodiment, the air-cavity package further includes an inner wall extending from the lower side of the top substrate body towards the upper side of the bottom substrate body. The inner wall divides the cavity into a first cavity and a second cavity, and at least one of the bottom electronic component and the top electronic component is exposed to the first cavity.

According to another embodiment, the air-cavity package is included in a system assembly. Besides the air-cavity package, the system assembly also includes a cold plate and a printed circuit board (PCB) with a heat sink extending through the PCB. Herein, the cold plate resides over and is thermally coupled to the top metal layer. The lower side of the bottom substrate body is over the PCB such that the bottom signal via is electrically coupled to the PCB and the at least one bottom thermally conductive structure is thermally coupled to the heat sink.

According to an exemplary process for making an air-cavity package, a bottom package precursor including a bottom substrate and a bottom electronic component is provided. The bottom substrate includes a bottom substrate body having an upper side and a lower side, at least one bottom metal structure on the upper side of the bottom substrate body, and at least one bottom thermally conductive structure that extends from the upper side of the bottom substrate body through the bottom substrate body to the lower side of the bottom substrate body. The bottom electronic component is mounted on the upper side of the bottom substrate body, where the at least one bottom thermally conductive structure is thermally coupled to the bottom electronic component and conducts heat generated from the bottom electronic component toward the lower side of the bottom substrate body. Next, a top package precursor including a top substrate and a top electronic component is provided. The top substrate includes a top substrate body having an upper side and a lower side, at least one top metal structure on the lower side of the top substrate body, and at least one top thermally conductive structure that extends from the upper side of the top substrate body through the top substrate body to the lower side of the top substrate body. The top electronic component is mounted on the lower side of the top substrate body, where the at least one top thermally conductive structure is thermally coupled to the top electronic component and conducts heat generated from the top electronic component toward the upper side of the top substrate body. In addition, a perimeter wall including at least one signal via structure extending from an upper surface of the perimeter wall through the perimeter wall to a lower surface of the perimeter wall is then provided. Finally, the bottom package precursor, the perimeter wall, and the top package precursor are assembled together. Herein, the perimeter wall extends from a periphery of the lower side of the top substrate body to a periphery of the upper side of the bottom substrate body such that a cavity is defined by a portion of the upper side of the bottom substrate body, an inside surface of the perimeter wall, and a portion of the lower side of the top substrate body. The bottom electronic component and the top electronic component are exposed to the cavity. The at least one signal via structure is electrically coupled to the at least one bottom metal structure and the at least one top metal structure.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

FIGS. 1A-1B provide an exemplary air-cavity package according to one embodiment of the present disclosure.

FIGS. 2A-2B provide an alternative air-cavity package according to one embodiment of the present disclosure.

FIG. 3 provides an exemplary system assembly including the exemplary air-cavity package shown in FIG. 1A.

FIG. 4 provides an exemplary system assembly including the alternative air-cavity package shown in FIG. 2A.

Figure 1A:
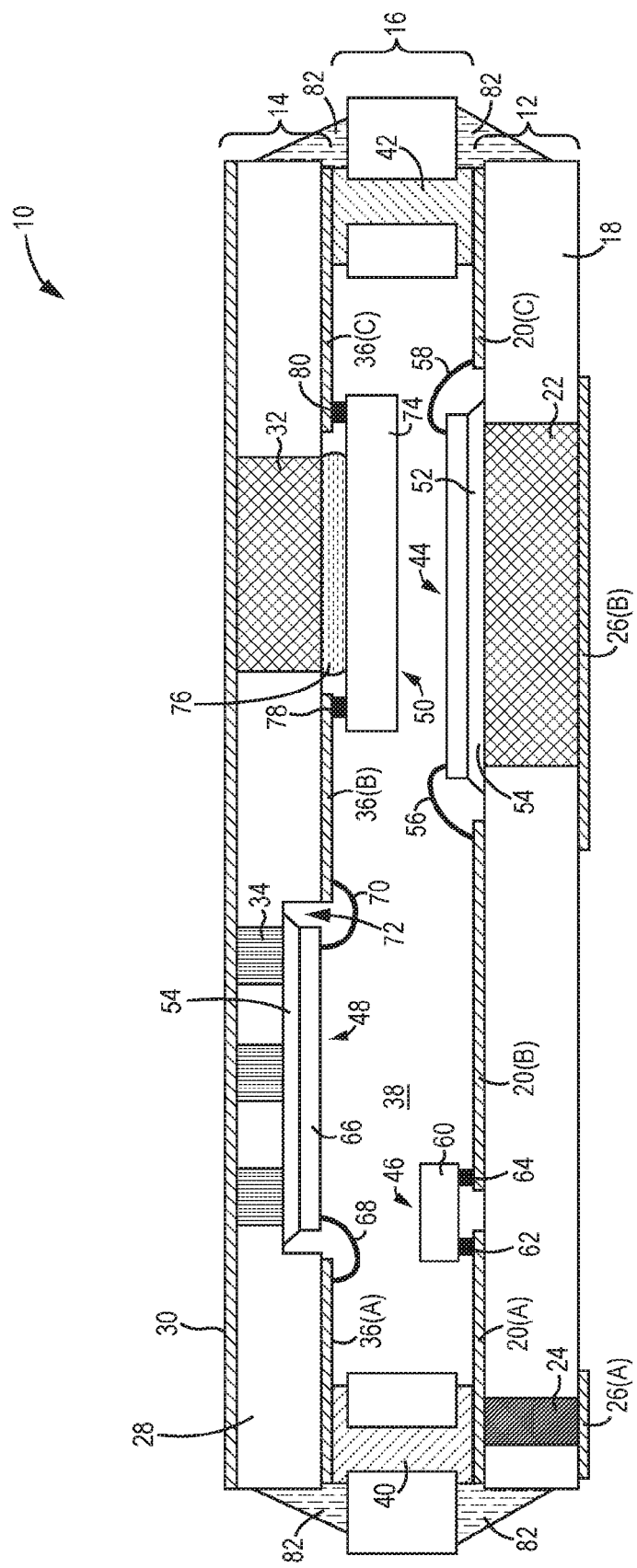

It will be understood that for clear illustrations, FIGS. 1A-6C may not be drawn to scale.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

FIG. 1A provides an exemplary air-cavity package 10 according to one embodiment of the present disclosure. In this embodiment, the air-cavity package 10 includes a bottom substrate 12, a top substrate 14, and a perimeter wall 16. In detail, the bottom substrate 12 is a multi-layer substrate (not shown) and includes a bottom substrate body 18 having an upper side and a lower side, a first bottom metal layer 20 on the upper side of the bottom substrate body 18, a bottom slug 22, a bottom signal via 24, and a second bottom metal layer 26 on the lower side of the bottom substrate body 18. For the purpose of this illustration, the first bottom metal layer 20 includes three separate metal structures: a first metal structure 20(A), a second metal structure 20(B), and a third metal structure 20(C). These metal structures 20(A)-20(C) of the first bottom metal layer 20 may be formed as metal pads and/or traces. The second bottom metal layer 26 includes two separate metal structures: a first metal structure 26(A) and a second metal structure 26(B). These metal structures 26(A) and 26(B) of the second bottom metal layer 26 may be formed as metal pads and/or traces. In different applications, the first bottom metal layer 20 and the second bottom metal layer 26 may include fewer or more metal structures.

The bottom slug 22 is a thermally conductive structure, which may have at least 100 W/m·k thermal conductivity. The bottom slug 22 extends from the upper side of the bottom substrate body 18 through the bottom substrate body 18 to the lower side of the bottom substrate body 18 and is thermally coupled to the second metal structure 26B of the second bottom metal layer 26. The bottom slug 22 may be formed from copper. In some applications, other thermally conductive structures, such as thermal vias, may also be included in the bottom substrate 12 in addition to or instead of the bottom slug 22. Further, the bottom signal via 24 extends from the upper side of the bottom substrate body 18 through the bottom substrate body 18 to the lower side of the bottom substrate body 18 and is electrically coupled to the first metal structure 20(A) of the first bottom metal layer 20 and the first metal structure 26(A) of the second bottom metal layer 26. In different applications, there may be fewer or more bottom signal vias included in the bottom substrate 12.

The top substrate 14 is a multi-layer substrate (not shown) and includes a top substrate body 28 having an upper side and a lower side, a first top metal layer 30 on the upper side of the top substrate body 28, a top slug 32, a number of top thermal vias 34 (only one top thermal via is labeled with a reference number for clarity), and a second top metal layer 36 on the lower side of the top substrate body 28. The top slug 32 and the top thermal vias 34 are thermally conductive structures. The top slug 32 and the top thermal vias 34 extend from the upper side of the top substrate body 28 through the top substrate body 28 to the lower side of the top substrate body 28. In different applications, there may be fewer or more top slugs/top thermal vias included in the top substrate 14. The top slug 32 may be formed from copper and the top thermal vias 34 may be filled with epoxy or plated by copper. The first top metal layer 30 resides over at least a portion of the upper side of the top substrate body 28 and is thermally coupled to the top slug 32 and the top thermal vias 34. In this embodiment, the first top metal layer 30 may be a continuous plate or sheet. For the purpose of this illustration, the second top metal layer 36 includes three separate metal structures: a first metal structure 36(A), a second metal structure 36(B), and a third metal structure 36(C). These metal structures 36(A)-36(C) of the second top metal layer 36 may be formed as metal pads and/or traces. In different applications, the second top metal layer 36 may include fewer or more metal structures.

The perimeter wall 16 extends from a periphery of the lower side of the top substrate body 28 to a periphery of the upper side of the bottom substrate body 18. As such, a cavity 38 is defined by a portion of the upper side of the bottom substrate body 18, an inside surface of the perimeter wall 16, and a portion of the lower side of the top substrate body 28. The perimeter wall 16 includes two separate via structures: a first signal via structure 40 and a second signal via structure 42. The first signal via structure 40 extends from an upper surface of the perimeter wall 16 through the perimeter wall 16 to a lower surface of the perimeter wall 16, and is electrically coupled to the first metal structure 20(A) of the first bottom metal layer 20 and the first metal structure 36(A) of the second top metal layer 36. The second signal via structure 42 extends from the upper surface of the perimeter wall 16 through the perimeter wall 16 to the lower surface of the perimeter wall 16, and is electrically coupled to the third metal structure 20(C) of the first bottom metal layer 20 and the third metal structure 36(C) of the second top metal layer 36.

In addition, the air-cavity package 10 also includes a number of electronic components mounted on the bottom substrate 12 and the top substrate 14. For the purpose of this illustration, the air-cavity package 10 includes a bottom wire-bonding die 44 and a bottom surface mounted device (SMD) 46 mounted on the upper side of the bottom substrate body 18, and a top wire-bonding die 48 and a top SMD 50 mounted on the lower side of the top substrate body 28. The bottom wire-bonding die 44, the bottom SMD 46, the top wire-bonding die 48, and the top SMD 50 are exposed to the cavity 38. In different applications, the air-cavity package 10 may include fewer or more wire-bonding dies and SMDs.

The bottom wire-bonding die 44 includes a bottom wire-bonding die body 52 mounted on the upper side of the bottom substrate body 18 via a die-attach material 54, a first bottom bonding wire 56 and a second bottom bonding wire 58. The first bottom bonding wire 56 extends from a top surface of the bottom wire-bonding die body 52 and is electrically coupled to the second metal structure 20(B) of the first bottom metal layer 20. The second bottom bonding wire 58 extends from the top surface of the bottom wire-bonding die body 52 and is electrically coupled to the third metal structure 20(C) of the first bottom metal layer 20. Herein, the bottom slug 22 is thermally coupled to the bottom wire-bonding die 44 and conducts heat generated from the bottom wire-bonding die 44 toward the lower side of the bottom substrate body 18.

The bottom SMD 46 includes a bottom SMD body 60, a first bottom SMD interconnect 62, and a second bottom SMD interconnect 64. The first bottom SMD interconnect 62 extends outward from a bottom surface of the bottom SMD body 60 and is coupled to the first metal structure 20(A) of the first bottom metal layer 20. The second bottom SMD interconnect 64 extends outward from the bottom surface of the bottom SMD body 60 and is coupled to the second metal structure 20(B) of the first bottom metal layer 20. The bottom SMD 46 may be a resistor, capacitor, inductor, or flip-chip die. If the bottom SMD 46 is a significant heat generator, there may be a thermally conductive structure (not shown) thermally coupled to the bottom SMD 46 and conducting heat generated from the bottom SMD 46 toward the lower side of the bottom substrate body 18.

The top wire-bonding die 48 includes a top wire-bonding die body 66 mounted on the lower side of the top substrate body 28 via the die-attach material 54, a first top bonding wire 68 and a second top bonding wire 70. The first top bonding wire 68 extends from a top surface of the top wire-bonding die body 66 and is electrically coupled to the first metal structure 36(A) of the second top metal layer 36. The second top bonding wire 70 extends from the top surface of the top wire-bonding die body 66 and is electrically coupled to the second metal structure 36(B) of the second top metal layer 36. In this embodiment, the lower side of the top substrate body 28 may not have a flat surface and may have a recess 72, in which the top wire-bonding die 48 is mounted. Herein, the top thermal vias 34 extend from the upper side of the top substrate body 28 to the recess 72, are thermally coupled to the top wire-bonding die 48, and conduct heat generated from the top wire-bonding die 48 toward the upper side of the top substrate body 28.

The top SMD 50 includes a top SMD body 74 mounted on the lower side of the top substrate body 28 via a SMD-attach material 76, a first top SMD interconnect 78, and a second top SMD interconnect 80. The first top SMD interconnect 78 extends outward from a bottom surface of the top SMD body 74 and is coupled to the second metal structure 36(B) of the second top metal layer 36. The second top SMD interconnect 80 extends outward from the bottom surface of the top SMD body 74 and is coupled to the third metal structure 36(C) of the second top metal layer 36. The top SMD 50 may be a resistor, capacitor, inductor, or flip-chip die. Herein, the top slug 32 is thermally coupled to the top SMD 50 and conducts heat generated from the top SMD 50 toward the upper side of the top substrate body 28.

Notice that the air-cavity package 10 has two heat dissipation interfaces: the lower side of the bottom substrate body 18 is a first heat dissipation interface and the upper side of the top substrate body 28 is a second heat dissipation interface. The two heat dissipation interfaces of the air-cavity package 10 may largely enhance the thermal performance of the air-cavity package 10. The heat generated from the electronic components mounted on the upper side of the bottom substrate body 18 (like the bottom wire-bonding die 44), may be conducted toward the lower side of the bottom substrate body 18 through the bottom thermally conductive structures (like the bottom slug 22). The heat generated from the electronic components mounted on the lower side of the top substrate body 28 (like the top wire-bonding die 48 and the top SMD 50), may be conducted toward the upper side of the top substrate body 28 through the top thermally conductive structures (like the top slug 32 and the top thermal vias 34). Herein each thermally conductive structure (the bottom slug 22, the top slug 32, or the top thermal vias 34) is directly in a heat dissipation path and adjacent to an electric component (the bottom wire-bonding die 44, the top wire-bonding die 48, or the top SMD 50).

Further, the first signal via structure 40 and the second signal via structure 42 may be used for radio frequency (RF) signal transitions between the electronic components mounted on the upper side of the bottom substrate body 18 (like the bottom wire-bonding die 44 and the bottom SMD 46) and the electronic components mounted on the lower side of the top substrate body 28 (the top wire-bonding die 48 and the top SMD 50). Herein, the first signal via structure 40 may be electrically isolated from the second signal via structure 42. In addition, RF signals generated by the electronic components mounted on the lower side of the top substrate body 28 (like the top wire-bonding die 48 and the top SMD 50) may be transited toward the lower side of the bottom substrate body 18 by the first signal via structure 40 and the bottom signal via 24. Herein, the bottom signal via 24, the first signal via structure 40, and the second signal via structure 42 are not directly in a heat dissipation path.

The air-cavity package 10 may also include a sealing material 82 used to seal off the cavity 38. The sealing material 82 extends about an exterior portion of a top junction, which is formed between the upper surface of the perimeter wall 16 and the lower side of the top substrate body 28, and an exterior portion of a bottom junction, which is formed between the lower surface of the perimeter wall 16 and the upper side of the bottom substrate body 18.

Figure 1B:
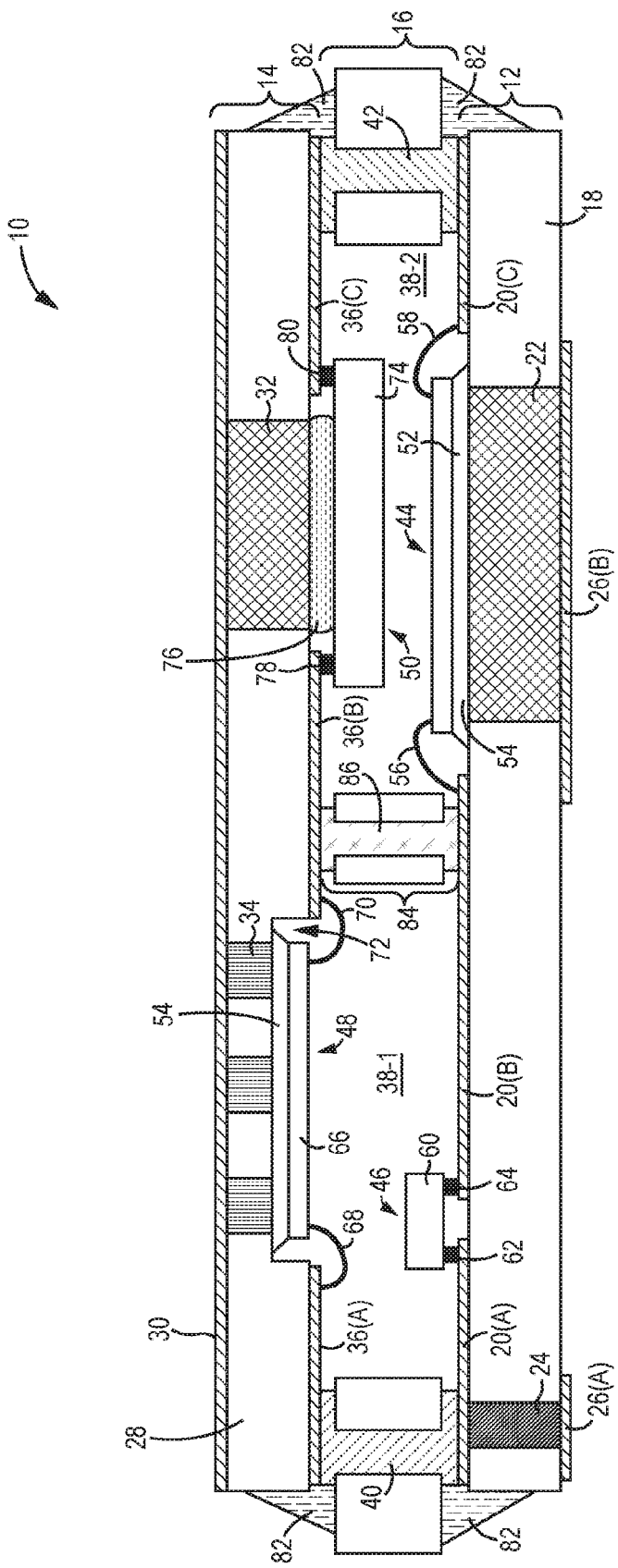

For some applications, as shown in FIG. 1B, the air-cavity package 10 may further include an inner wall 84 to separate different electronic components or provide mechanical support to the air-cavity package 10. In this embodiment, the inner wall 84 extends from the lower side of the top substrate body 28 towards the upper side of the bottom substrate body 18 and divides the cavity 38 into a first cavity 38-1 and a second cavity 38-2. The bottom SMD 46 and the top wire-bonding die 48 are exposed to the first cavity 38-1, and the bottom wire-bonding die 44 and the top SMD 50 are exposed to the second cavity 38-2. The inner wall 84 may include a third signal via structure 86 that extends from an upper surface of the inner wall 84 through the inner wall 84 to a lower surface of the inner wall 84, and is electrically coupled to the second metal structure 20(B) of the first bottom metal layer 20 and the second metal structure 36(B) of the second top metal layer 36. The third signal via structure 86 may be used for RF signal transitions between the electronic components mounted on the upper side of the bottom substrate body 18 (like the bottom wire-bonding die 44 and the bottom SMD 46) and the electronic components mounted on the lower side of the top substrate body 28 (the top wire-bonding die 48 and the top SMD 50). Herein, the third signal via structure 86 may be electrically isolated from the first signal via structure 40 and the second signal via structure 42.

Figure 2A:
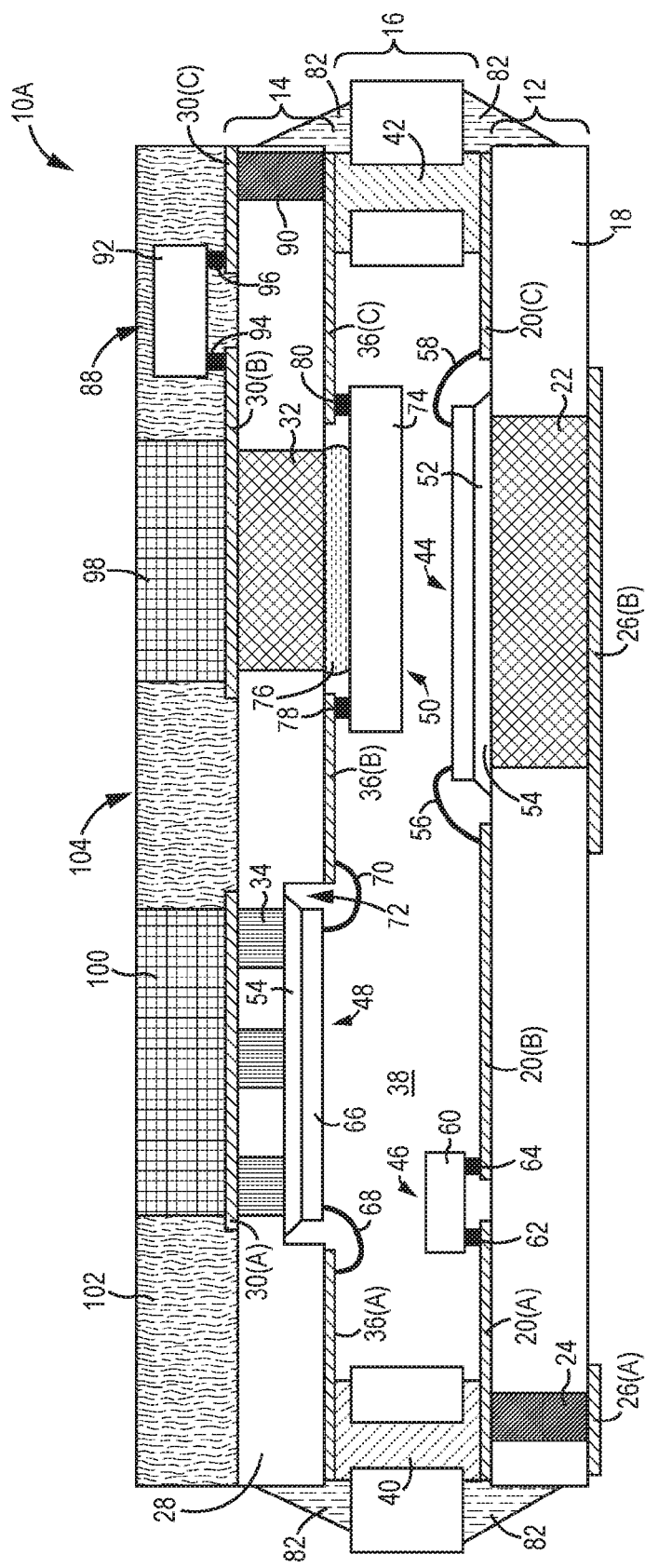

In order to further increase the package integration level, an external SMD 88 may be mounted on the upper side of the top substrate body 28 and not within the cavity 38. FIG. 2A provides an alternative air-cavity package 10A according to one embodiment of the present disclosure. In this embodiment, the top substrate 14 further includes a top signal via 90 extending from the upper side of the top substrate body 28 through the top substrate body 28 to the lower side of the top substrate body 28 and coupled to the third metal structure 36(C) of the second top metal layer 36. In addition, the first top metal layer 30 is not continuous, but includes three separate metal structures: a first metal structure 30(A), a second metal structure 30(B), and a third metal structure 30(C). These metal structures 30(A)-30(C) of the first top metal layer 30 may be formed as metal pads and/or traces. The top thermal vias 34 are thermally coupled to the first metal structure 30(A) of the first top metal layer 30, the top slug 32 is thermally coupled to the second metal structure 30(B) of the first top metal layer 30, and the top signal via 90 is electrically coupled to the third metal structure 30(C) of the first top metal layer 30.

The external SMD 88 includes an external SMD body 92, a first external SMD interconnect 94, and a second external SMD interconnect 96. The first external SMD interconnect 94 extends outward from a bottom surface of the external SMD body 92 and is coupled to the second metal structure 30(B) of the first top metal layer 30. The second external SMD interconnect 96 extends outward from the bottom surface of the external SMD body 92 and is coupled to the third metal structure 30(C) of the first top metal layer 30. Herein, the top signal via 90 may be used for signal transitions between the external SMD 88 and the top SMD 50. Further, RF signals generated by the external SMD 88 may be transited to the bottom wire-bonding die 44 by the top signal via 90 and the second signal via structure 42. In different applications, the air-cavity package 10A may include multiple external SMDs mounted on the upper side of the top substrate body 28. The external SMD 88 may be a resistor, capacitor, inductor, or flip-chip die.

The air-cavity package 10A may also include a first external thermally conductive structure 98 and a second external thermally conductive structure 100. The first external thermally conductive structure 98 resides over the upper side of the top substrate body 28 and is thermally coupled to the top slug 32 by the second metal structure 30(B) of the first top metal layer 30. The second external thermally conductive structure 100 resides over the upper side of the top substrate body 28 and is thermally coupled to the top thermal vias 34 by the first metal structure 30(A) of the first top metal layer 30. The first external thermally conductive structure 98 and the second external thermally conductive structure 100 may be formed from copper slugs.

Further, the air-cavity package 10A may include a mold compound component 102, which resides over the upper side of the top substrate body 28 to encapsulate the external SMD 88 and sides of the first external thermally conductive structure 98 and the second external thermally conductive structure 100. An upper surface of the first external thermally conductive structure 98 and an upper surface of the second external thermally conductive structure 100 are exposed, and may be at a same top plane 104 as an upper surface of the mold compound component 102.

Notice that the air-cavity package 10A has two heat dissipation interfaces: the lower side of the bottom substrate body 18 is the first heat dissipation interface and the top plane 104 is the second heat dissipation interface. The heat generated from the electronic components mounted on the upper side of the bottom substrate body 18 (like the bottom wire-bonding die 44), is conducted toward the lower side of the bottom substrate body 18 through the bottom thermally conductive structures (like the bottom slug 22). The heat generated from the electronic components mounted on the lower side of the top substrate body 28 (like the top wire-bonding die 48 and the top SMD 50), is conducted toward the top plane 104 through the top thermally conductive structures (like the top slug 32 and the top thermal vias 34), and the external thermally conductive structures (like the first external thermally conductive structure 98 and the second external thermally conductive structure 100).

Figure 2B:
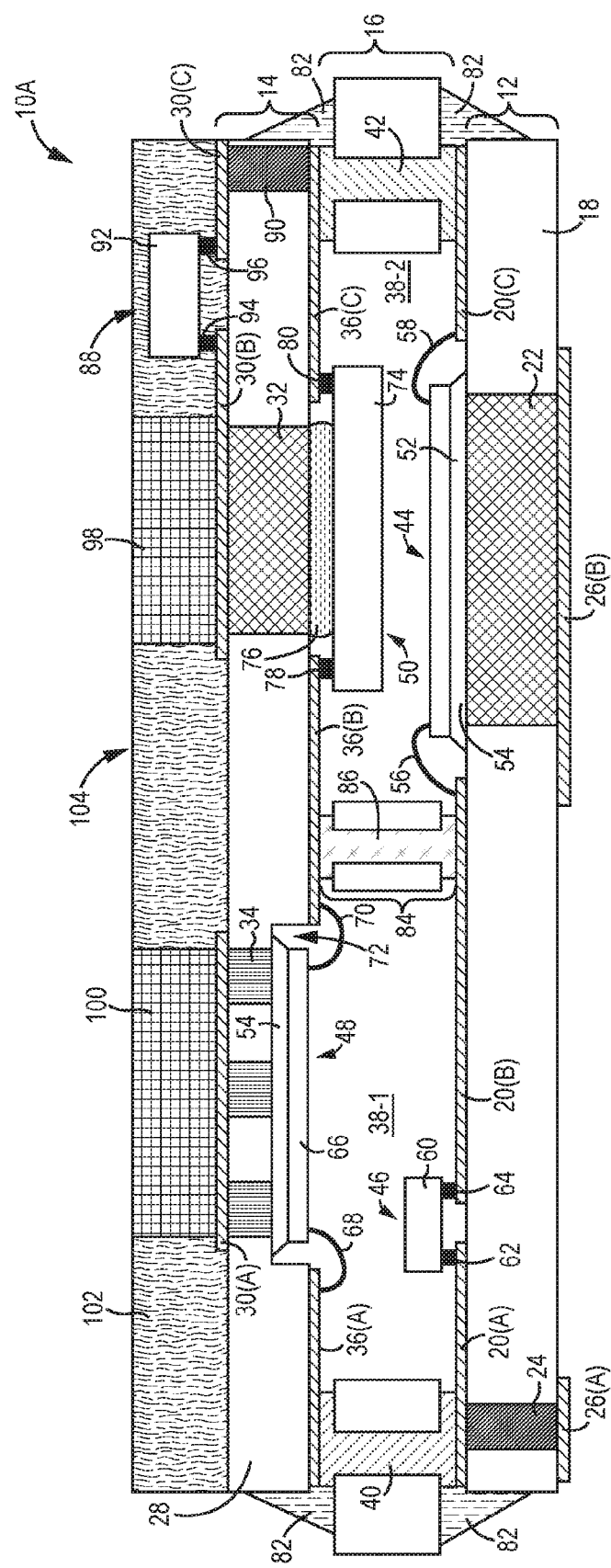

For some applications, as shown in FIG. 2B, the air-cavity package 10A may further include the inner wall 84 to separate different electronic components or provide mechanical support to the air-cavity package 10A. In this embodiment, the inner wall 84 extends from the lower side of the top substrate body 28 towards the upper side of the bottom substrate body 18 and divides the cavity 38 into the first cavity 38-1 and the second cavity 38-2. The bottom SMD 46 and the top wire-bonding die 48 are exposed to the first cavity 38-1, and the bottom wire-bonding die 44 and the top SMD 50 are exposed to the second cavity 38-2. The inner wall 84 may include the third signal via structure 86 that extends from the upper surface of the inner wall 84 through the inner wall 84 to the lower surface of the inner wall 84, and is electrically coupled to the second metal structure 20(B) of the first bottom metal layer 20 and the second metal structure 36(B) of the second top metal layer 36. The third signal via structure 86 may be used for RF signal transitions between the electronic components mounted on the upper side of the bottom substrate body 18 (like the bottom wire-bonding die 44 and the bottom SMD 46) and the electronic components mounted on the lower side of the top substrate body 28 (the top wire-bonding die 48 and the top SMD 50). Herein, the third signal via structure 86 may be electrically isolated from the first signal via structure 40 and the second signal via structure 42.

Figure 3:
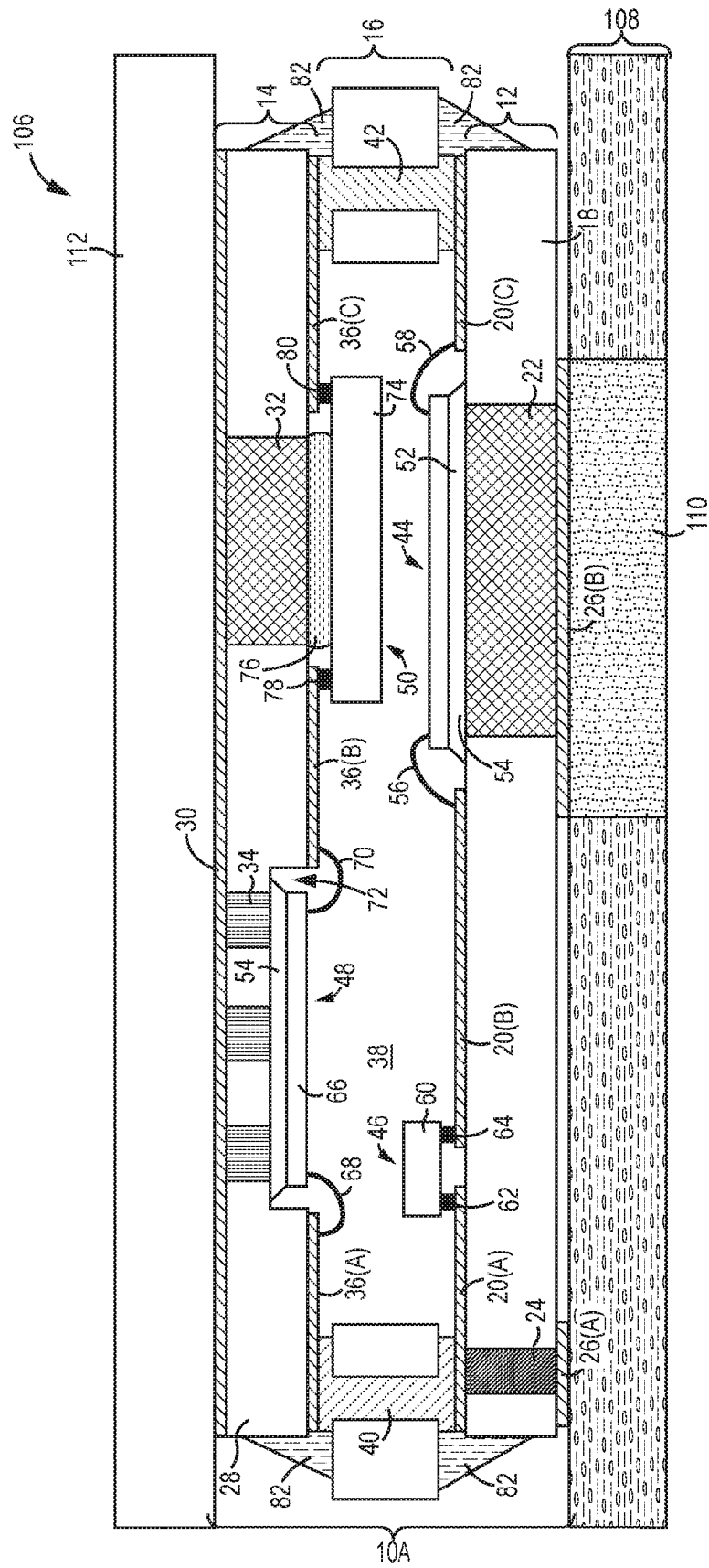

FIG. 3 provides an exemplary system assembly 106 including the air-cavity package 10 shown in FIG. 1A. Besides the air-cavity package 10, the system assembly 106 also includes a printed circuit board (PCB) 108 with a heat sink 110 extending through the PCB 108, and a cold plate 112. The lower side of the bottom substrate body 18 is over the PCB 108, such that the bottom signal via 24 is electrically coupled to the PCB 108 by the first metal structure 26(A) of the second bottom metal layer 26. The bottom slug 22 is thermally coupled to the heat sink 110 of the PCB 108 by the second metal structure 26(B) of the second bottom metal layer 26. In addition, the cold plate 112 resides over and is thermally coupled to the first top metal layer 30. Consequently, the heat generated from the electronic components mounted on the upper side of the bottom substrate body 18 (like the bottom wire-bonding die 44), is conducted toward the heat sink 110 of the PCB 108 through the bottom thermally conductive structures (like the bottom slug 22). The heat generated from the electronic components mounted on the lower side of the top substrate body 28 (like the top wire-bonding die 48 and the top SMD 50), is conducted to the cold plate 112 through the top thermally conductive structures (like the top slug 32 and the top thermal vias 34).

Figure 4:
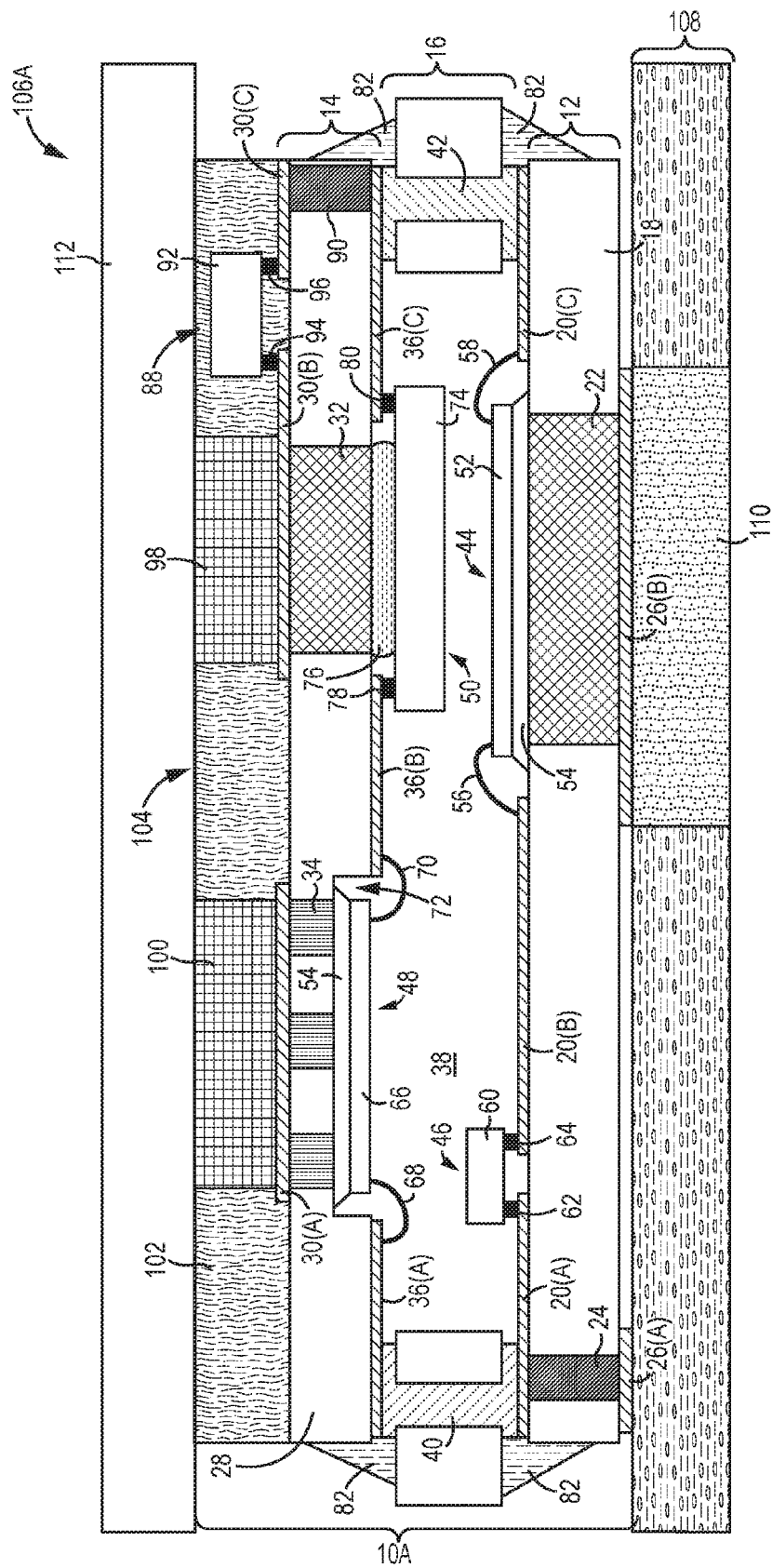

FIG. 4 provides an exemplary system assembly 106A including the air-cavity package 10A shown in FIG. 2A. Besides the air-cavity package 10A, the system assembly 106A also includes the PCB 108 with the heat sink 110 extending through the PCB 108, and the cold plate 112. The lower side of the bottom substrate body 18 is over the PCB 108, such that the bottom signal via 24 is electrically coupled to the PCB 108 by the first metal structure 26(A) of the second bottom metal layer 26. The bottom slug 22 is thermally coupled the heat sink 110 of the PCB 108 by the second metal structure 26(B) of the second bottom metal layer 26. In addition, the cold plate 112 resides over and is thermally coupled to the first external thermally conductive structure 98 and the second external thermally conductive structure 100. Consequently, the heat generated from the electronic components mounted on the upper side of the bottom substrate body 18 (like the bottom wire-bonding die 44), is conducted toward the heat sink 110 of the PCB 108 through the bottom thermally conductive structures (like the bottom slug 22). The heat generated from the electronic components mounted on the lower side of the top substrate body 28 (like the top wire-bonding die 48 and the top SMD 50), is conducted to the cold plate 112 through the top thermally conductive structures (like the top slug 32 and the top thermal vias 34), and the external thermally conductive structures, (like the first external thermally conductive structure 98 and the second external thermally conductive structure 100).

Figure 5A:
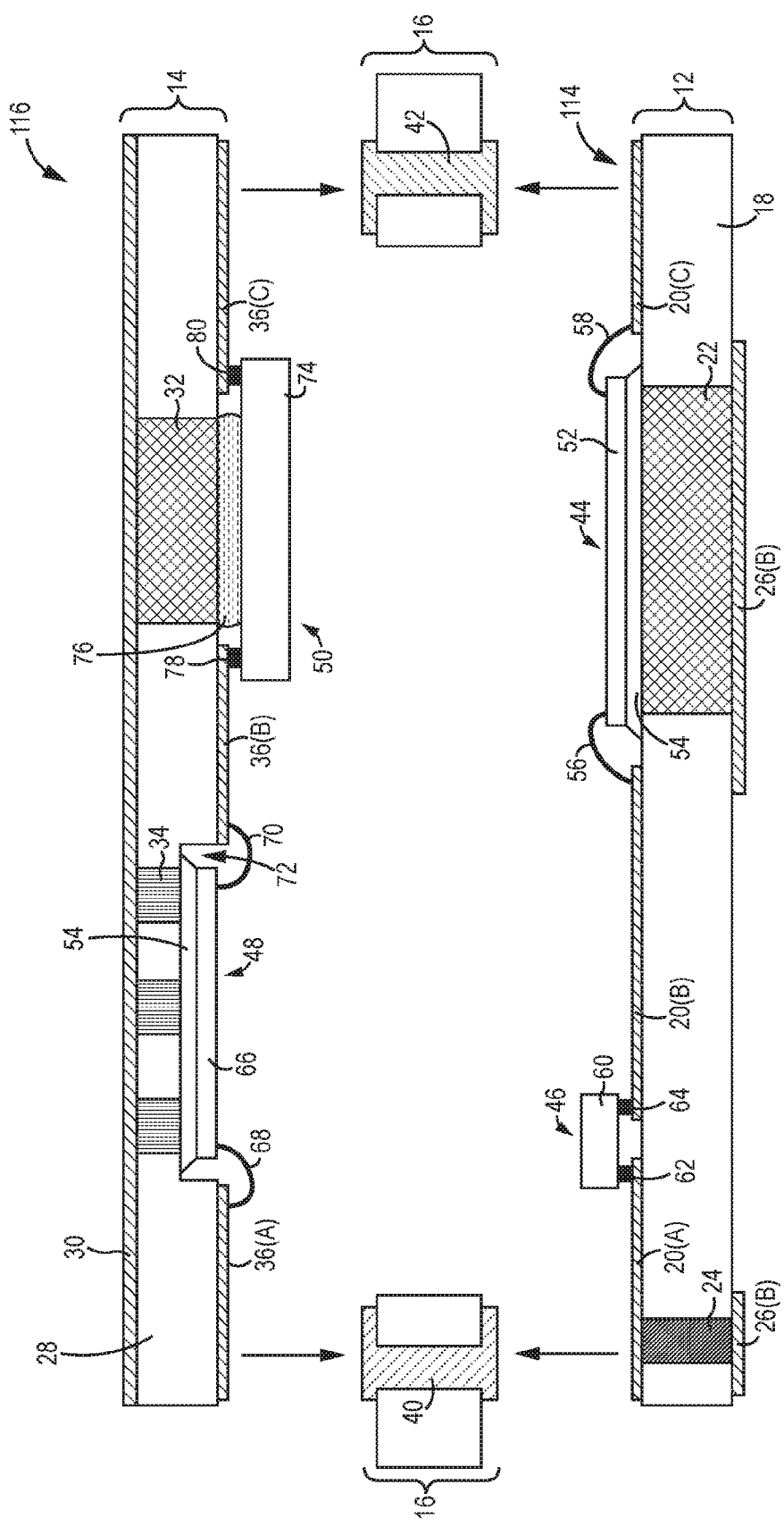
FIGS. 5A-5C illustrate an exemplary process to form the exemplary air-cavity package shown in FIG. 1A according to one embodiment of the present disclosure.
Figure 5B:
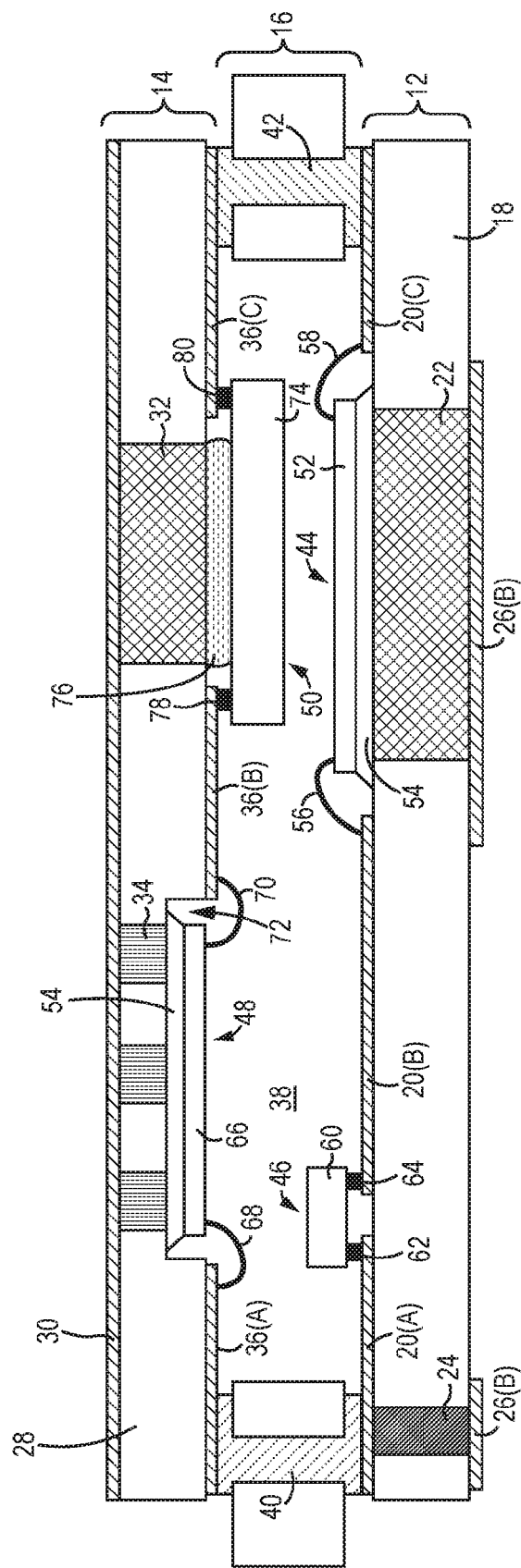
Figure 5C:
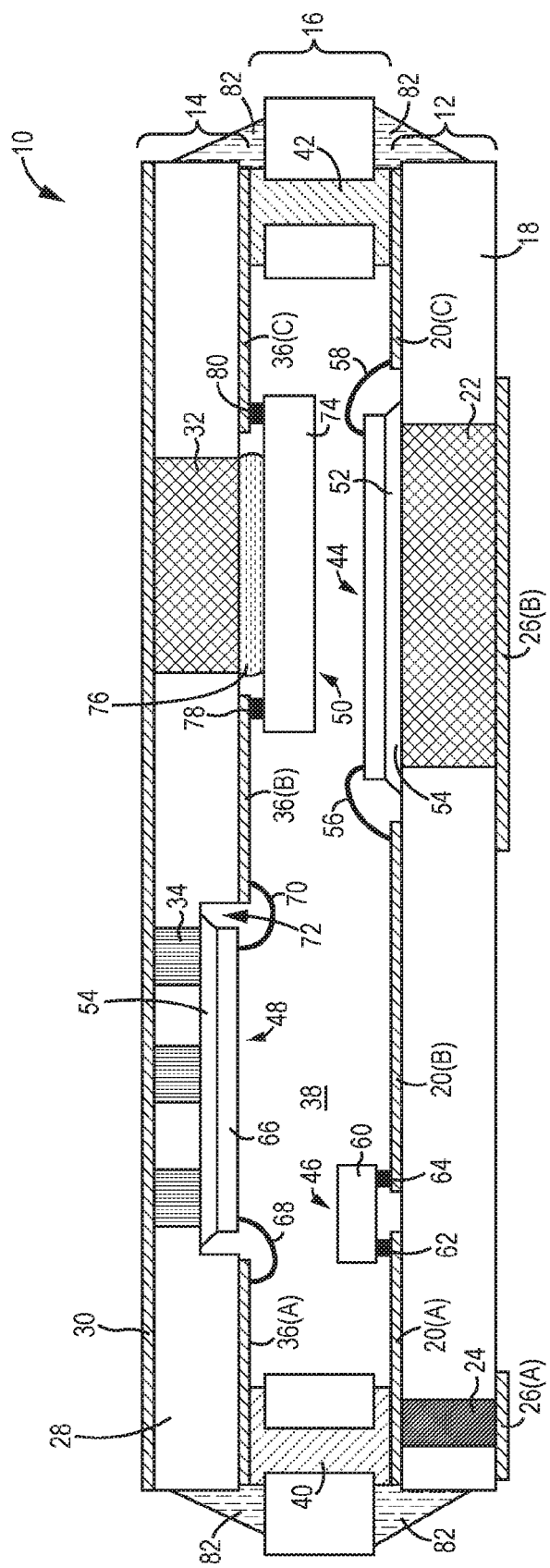

FIGS. 5A-5C illustrate an exemplary process to form the exemplary air-cavity package 10 shown in FIG. 1A. Although the exemplary process is illustrated as a series of sequential steps, the exemplary process is not necessarily order dependent. Some operations may be done in a different order than that presented. Further, processes within the scope of this disclosure may include fewer or more operations than those illustrated in FIGS. 5A-5C.

Initially, a bottom package precursor 114, a top package precursor 116, and the perimeter wall 16 are provided as depicted in FIG. 5A. The bottom package precursor 114 includes the bottom substrate 12, the bottom wire-bonding die 44, and the bottom SMD 46. The configurations of the bottom substrate 12, the bottom wire-bonding die 44, and the bottom SMD 46 are the same as described above. As such, the bottom wire-bonding die body 52 of the bottom wire-bonding die 44 is mounted on the upper side of the bottom substrate body 18 via the die-attach material 54. The first bottom bonding wire 56 of the bottom wire-bonding die 44 is electrically coupled to the second metal structure 20(B) of the bottom substrate 12. The second bottom bonding wire 58 of the bottom wire-bonding die 44 is electrically coupled to the third metal structure 20(C) of the bottom substrate 12. Herein, the bottom slug 22 is thermally coupled to the bottom wire-bonding die 44, and will conduct heat generated from the bottom wire-bonding die 44 toward the lower side of the bottom substrate body 18. The bottom SMD 46 resides over the upper side of the bottom substrate body 18. The first bottom SMD interconnect 62 of the bottom SMD 46 is coupled to the first metal structure 20(A) of the bottom substrate 12. The second bottom SMD interconnect 64 of the bottom SMD 46 is coupled to the second metal structure 20(B) of the bottom substrate 12. Herein, the bottom signal via 24 is electrically coupled to bottom SMD 46.

In addition, the top package precursor 116 includes the top substrate 14, the top wire-bonding die 48, and the top SMD 50. The configurations of the top substrate 14, the top wire-bonding die 48, and the top SMD 50 are the same as described above. As such, the top wire-bonding die body 66 of the top wire-bonding die 48 is mounted on the lower side of the top substrate body 28 via the die-attach material 54. The first top bonding wire 68 of the top wire-bonding die 48 is electrically coupled to the first metal structure 36(A) of the top substrate 14. The second top bonding wire 70 of the top wire-bonding die 48 is electrically coupled to the second metal structure 36(B) of the top substrate 14. Herein, the top thermal vias 34 are thermally coupled to the top wire-bonding die 48, and will conduct heat generated from the top wire-bonding die 48 toward the upper side of the top substrate body 28. The top SMD body 74 of the top SMD 50 is mounted on the lower side of the top substrate body 28 via the SMD-attach material 76. The first top SMD interconnect 78 of the top SMD 50 is coupled to the second metal structure 36(B) of the top substrate 14. The second top SMD interconnect 80 of the top SMD 50 is coupled to the third metal structure 36(C) of the top substrate 14. Herein, the top slug 32 is thermally coupled to the top SMD 50, and will conduct heat generated from the top SMD 50 toward the upper side of the top substrate body 28.

Next, the bottom package precursor 114, the top package precursor 116, and the perimeter wall 16 are assembled together as depicted in FIG. 5B. The perimeter wall 16 extends from the periphery of the lower side of the top substrate body 28 to the periphery of the upper side of the bottom substrate body 18 such that the cavity 38 is defined by a portion of the upper side of the bottom substrate body 18, the inside surface of the perimeter wall 16, and a portion of the lower side of the top substrate body 28. The bottom wire-bonding die 44, the bottom SMD 46, the top wire-bonding die 48, and the top SMD 50 are exposed to the cavity 38. The first signal via structure 40 of the perimeter wall 16 is electrically coupled to the first metal structure 20(A) of the bottom substrate 12 and the first metal structure 36(A) of the top substrate 14. The second signal via structure 42 of the perimeter wall 16 is electrically coupled to the third metal structure 20(C) of the bottom substrate 12 and the third metal structure 36(C) of the top substrate 14.

Finally, the sealing material 82 is applied to an exterior portion of the top junction, which is formed between the upper surface of the perimeter wall 16 and the lower side of the top substrate body 28, and an exterior portion of the bottom junction, which is formed between the lower surface of the perimeter wall 16 and the upper side of the bottom substrate body 18 as depicted in FIG. 5C. The cavity 38 is sealed off by the sealing material 82, and the air-cavity package 10 is formed.

Figure 6A:
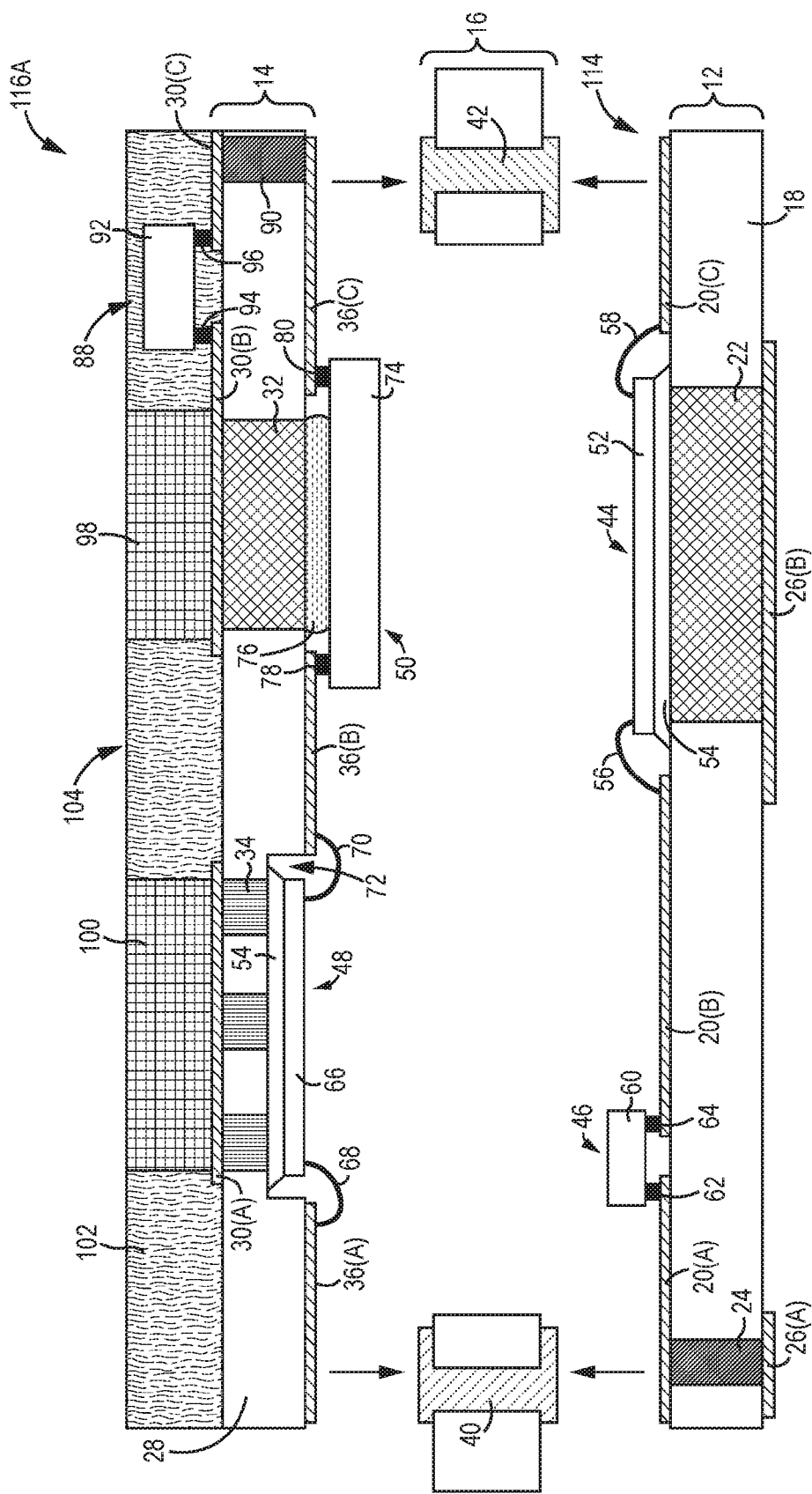
FIGS. 6A-6C illustrate an exemplary process to form the alternative air-cavity package shown in FIG. 2A according to one embodiment of the present disclosure.
Figure 6B:
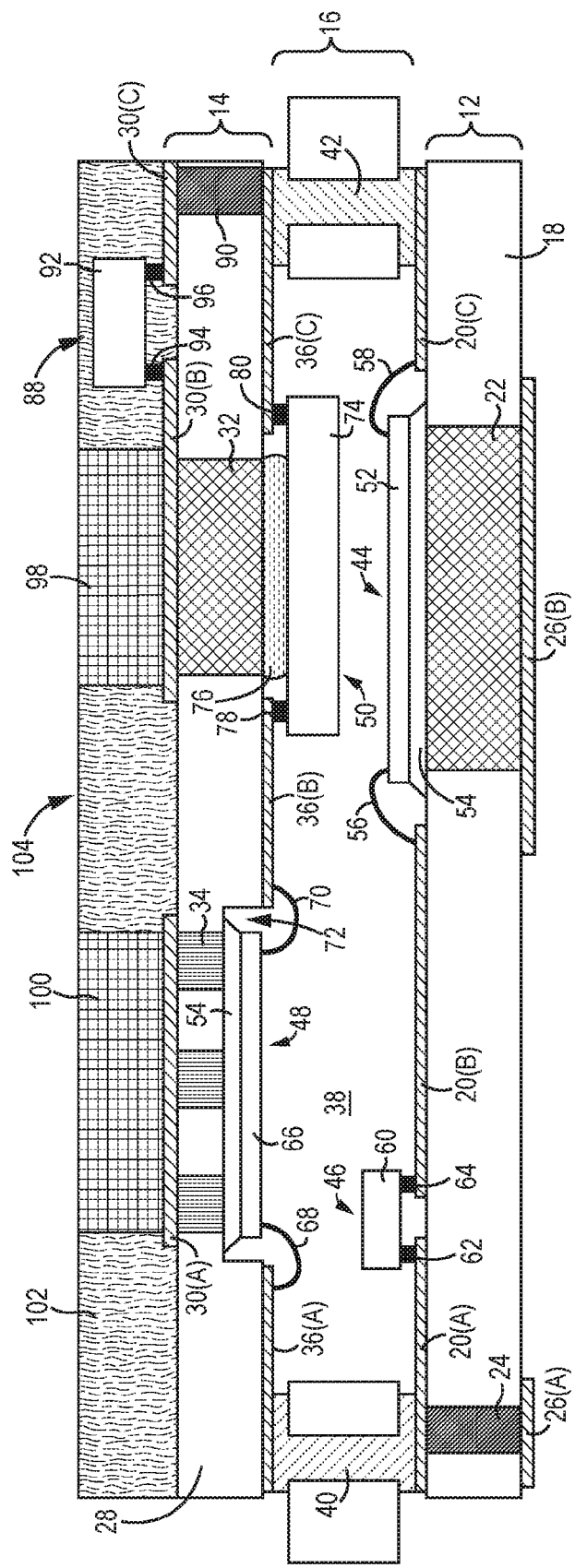
Figure 6C:
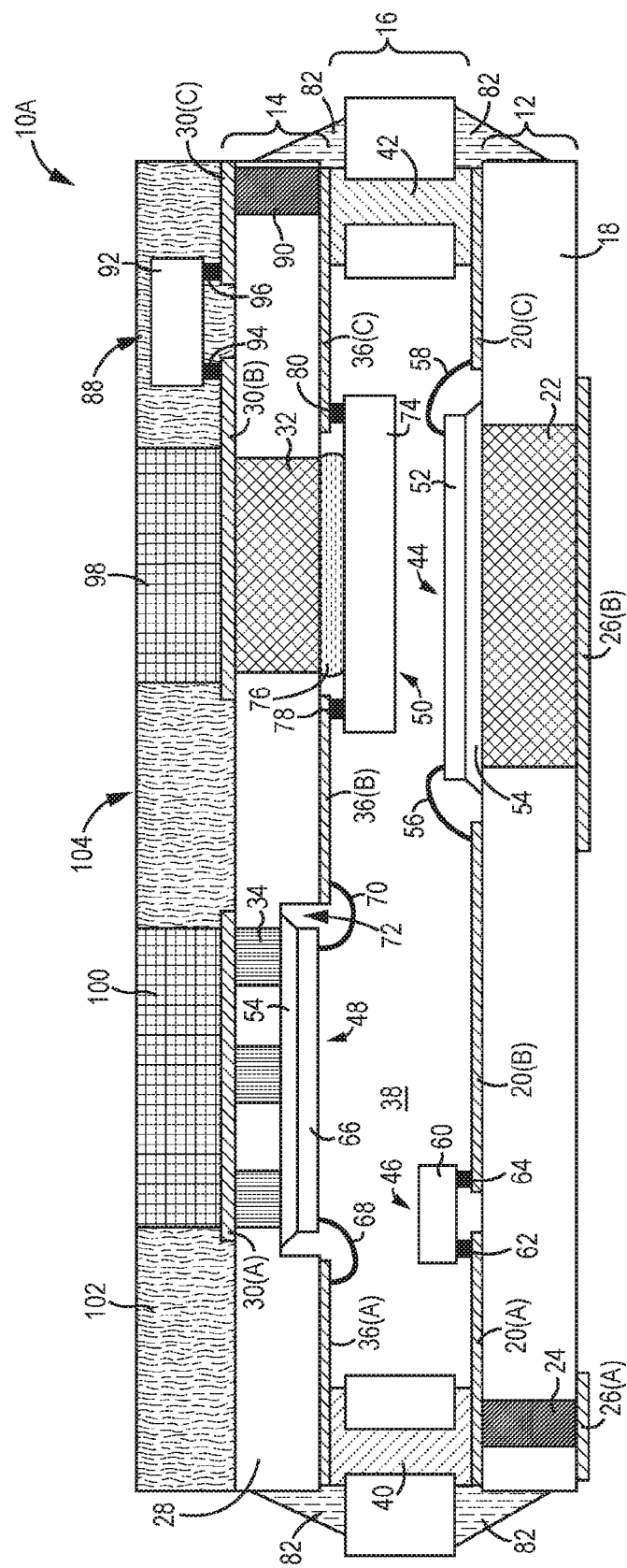

FIGS. 6A-6C illustrate an exemplary process to form the air-cavity package 10A shown in FIG. 2A. Although the exemplary process is illustrated as a series of sequential steps, the exemplary process is not necessarily order dependent. Some operations may be done in a different order than that presented. Further, processes within the scope of this disclosure may include fewer or more operations than those illustrated in FIGS. 6A-6C.

Initially, the bottom package precursor 114, an alternative top package precursor 116A, and the perimeter wall 16 are provided as depicted in FIG. 6A. The bottom package precursor 114 includes the bottom substrate 12, the bottom wire-bonding die 44, and the bottom SMD 46. The configurations of the bottom substrate 12, the bottom wire-bonding die 44, and the bottom SMD 46 are the same as described above. As such, the bottom wire-bonding die body 52 of the bottom wire-bonding die 44 is mounted on the upper side of the bottom substrate body 18 via the die-attach material 54. The first bottom bonding wire 56 of the bottom wire-bonding die 44 is electrically coupled to the second metal structure 20(B) of the bottom substrate 12. The second bottom bonding wire 58 of the bottom wire-bonding die 44 is electrically coupled to the third metal structure 20(C) of the bottom substrate 12. Herein, the bottom slug 22 is thermally coupled to the bottom wire-bonding die 44 and will conduct heat generated from the bottom wire-bonding die 44 toward the lower side of the bottom substrate body 18. The bottom SMD 46 resides over the upper side of the bottom substrate body 18. The first bottom SMD interconnect 62 of the bottom SMD 46 is coupled to the first metal structure 20(A) of the bottom substrate 12. The second bottom SMD interconnect 64 of the bottom SMD 46 is coupled to the second metal structure 20B of the bottom substrate 12. Herein, the bottom signal via 24 is electrically coupled to bottom SMD 46.

In addition, the top package precursor 116A includes the top substrate 14, the top wire-bonding die 48, the top SMD 50, the external SMD 88, the first external thermally conductive structure 98, the second external thermally conductive structure 100, and the mold compound component 102. The configurations of the top substrate 14, the top wire-bonding die 48, the top SMD 50, the external SMD 88, the first external thermally conductive structure 98, the second external thermally conductive structure 100, and the mold compound component 102 are the same as described above. As such, the top wire-bonding die body 66 of the top wire-bonding die 48 is mounted on the lower side of the top substrate body 28 via the die-attach material 54. The first top bonding wire 68 of the top wire-bonding die 48 is electrically coupled to the first metal structure 36(A) of the top substrate 14. The second top bonding wire 70 of the top wire-bonding die 48 is electrically coupled to the second metal structure 36(B) of the top substrate 14. Herein, the top thermal vias 34 are thermally coupled to the top wire-bonding die 48. The top SMD body 74 of the top SMD 50 is mounted on the lower side of the top substrate body 28 via the SMD-attach material 76. The first top SMD interconnect 78 of the top SMD 50 is coupled to the second metal structure 36B of the top substrate 14. The second top SMD interconnect 80 of the top SMD 50 is coupled to the third metal structure 36C of the top substrate 14. Herein, the top slug 32 is thermally coupled to the top SMD 50 and the top signal via 90 is electrically coupled to top SMD 50.

The external SMD 88 resides over the upper side of the top substrate body 28. The first external SMD interconnect 94 of the external SMD 88 is coupled to the second metal structure 30(B) of the top substrate 14. The second external SMD interconnect 96 of the external SMD 88 is coupled to the third metal structure 30(C) of the top substrate 14. The first external thermally conductive structure 98 is thermally coupled to the top slug 32 by the second metal structure 30(B) of the top substrate 14. The second external thermally conductive structure 100 is thermally coupled to the top thermal vias 34 by the first metal structure 30(A) of the top substrate 14. Further, the mold compound component 102 resides over the upper side of the top substrate body 28 to encapsulate the external SMD 88 and sides of the first external thermally conductive structure 98 and the second external thermally conductive structure 100. The upper surface of the first external thermally conductive structure 98 and the upper surface of the second external thermally conductive structure 100 are exposed, and may be at the same top plane 104 as the upper surface of the mold compound component 102. Herein, the heat generated from the top SMD 50 is conducted toward the top plane 104 through the top slug 32 and the first external thermally conductive structure 98, and the heat generated from the top wire-bonding die 48 is conducted toward the top plane 104 through the top thermal vias 34 and the second external thermally conductive structure 100.

Next, the bottom package precursor 114, the top package precursor 116A, and the perimeter wall 16 are assembled together as depicted in FIG. 6B. The perimeter wall 16 extends from the periphery of the lower side of the top substrate body 28 to the periphery of the upper side of the bottom substrate body 18 such that the cavity 38 is defined by a portion of the upper side of the bottom substrate body 18, the inside surface of the perimeter wall 16, and a portion of the lower side of the top substrate body 28. The bottom wire-bonding die 44, the bottom SMD 46, the top wire-bonding die 48, and the top SMD 50 are exposed to the cavity 38. The external SMD 88, the first external thermally conductive structure 98, and the second external thermally conductive structure 100 are not within the cavity 38. The first signal via structure 40 is electrically coupled to the first metal structure 20(A) of the bottom substrate 12 and the first metal structure 36(A) of the top substrate 14. The second signal via structure 42 is electrically coupled to the third metal structure 20(C) of the bottom substrate 12 and the third metal structure 36(C) of the top substrate 14.

Finally, the sealing material 82 is applied to an exterior portion of the top junction, which is formed between the upper surface of the perimeter wall 16 and the lower side of the top substrate body 28, and an exterior portion of the bottom junction, which is formed between the lower surface of the perimeter wall 16 and the upper side of the bottom substrate body 18 as depicted in FIG. 6C. The cavity 38 is sealed off by the sealing material 82, and the air-cavity package 10A is formed.

Those skilled in the art will recognize improvements and modifications to the preferred embodiments of the present disclosure. All such improvements and modifications are considered within the scope of the concepts disclosed herein and the claims that follow.

What is claimed is:

1. An apparatus comprising:
   a bottom substrate comprising a bottom substrate body having an upper side and a lower side, at least one bottom metal structure on the upper side of the bottom substrate body, and at least one bottom thermally conductive structure that extends from the upper side of the bottom substrate body through the bottom substrate body to the lower side of the bottom substrate body;
   a top substrate comprising a top substrate body having an upper side and a lower side, at least one top metal structure on the lower side of the top substrate body, and at least one top thermally conductive structure that extends from the upper side of the top substrate body through the top substrate body to the lower side of the top substrate body;
   a perimeter wall extending from a periphery of the lower side of the top substrate body to a periphery of the upper side of the bottom substrate body such that a cavity is defined by a portion of the upper side of the bottom substrate body, an inside surface of the perimeter wall, and a portion of the lower side of the top substrate body, wherein at least one signal via structure extends from an upper surface of the perimeter wall through the perimeter wall to a lower surface of the perimeter wall, and is electrically coupled to the at least one bottom metal structure and the at least one top metal structure;
   a bottom electronic component mounted on the upper side of the bottom substrate body and exposed to the cavity, wherein the at least one bottom thermally conductive structure is thermally coupled to the bottom electronic component and conducts heat generated from the bottom electronic component toward the lower side of the bottom substrate body; and
   a top electronic component mounted on the lower side of the top substrate body and exposed to the cavity, wherein the at least one top thermally conductive structure is thermally coupled to the top electronic component and conducts heat generated from the top electronic component toward the upper side of the top substrate body.

2. The apparatus of claim 1 further comprising a printed circuit board (PCB) with a heat sink extending through the PCB, wherein the lower side of the bottom substrate body is over the PCB and the at least one bottom thermally conductive structure is thermally coupled to the heat sink.

3. The apparatus of claim 1 wherein the bottom substrate further comprises a bottom signal via extending from the upper side of the bottom substrate body through the bottom substrate body to the lower side of the bottom substrate body, wherein the bottom signal via is electrically coupled to the at least one bottom metal structure and separated from the at least one bottom thermally conductive structure.

4. The apparatus of claim 3 further comprising a printed circuit board (PCB) with a heat sink extending through the PCB, wherein:
   the lower side of the bottom substrate body is over the PCB such that the bottom signal via is electrically coupled to the PCB; and
   the at least one bottom thermally conductive structure is thermally coupled to the heat sink.

5. The apparatus of claim 1 wherein the top substrate further comprises a top metal layer over at least a portion of the upper side of the top substrate body and thermally coupled to the at least one top thermally conductive structure.

6. The apparatus of claim 5 wherein the top metal layer is a continuous plate or sheet.

7. The apparatus of claim 5 further comprising a cold plate that resides over and is thermally coupled to the top metal layer.

8. The apparatus of claim 1 wherein the bottom electronic component is one from a group consisting of a resistor, a capacitor, an inductor, a flip-chip die, and a wire-bonding die.

9. The apparatus of claim 1 wherein the top electronic component is one from a group consisting of a resistor, a capacitor, an inductor, a flip-chip die, and a wire-bonding die.

10. The apparatus of claim 1 further comprising:
a top junction formed between the upper surface of the perimeter wall and the lower side of the top substrate body, and a bottom junction formed between the lower surface of the perimeter wall and the upper side of the bottom substrate body; and
a sealing material that extends about an exterior portion of the top junction and an exterior portion of the bottom junction to seal off the cavity.

11. The apparatus of claim 1 wherein the at least one bottom thermally conductive structure comprises a plurality of thermal vias.

12. The apparatus of claim 1 wherein the at least one bottom thermally conductive structure comprises a slug.

13. The apparatus of claim 1 wherein the at least one top thermally conductive structure comprises a plurality of thermal vias.

14. The apparatus of claim 1 wherein the at least one top thermally conductive structure comprises a slug.

15. The apparatus of claim 1 further comprising an inner wall extending from the lower side of the top substrate body towards the upper side of the bottom substrate body, wherein:
the inner wall divides the cavity into a first cavity and a second cavity; and
at least one of the bottom electronic component and the top electronic component is exposed to the first cavity.

16. The apparatus of claim 1 wherein:
the at least one signal via structure comprises a first signal via structure and a second signal via structure, which is separated from the first signal via structure;
the at least one bottom metal structure comprises a first bottom metal structure and a second bottom metal structure, which is separated from the first bottom metal structure;
the at least one top metal structure comprises a first top metal structure and a second top metal structure, which is separated from the first top metal structure; and
the first signal via structure is electrically coupled to the first bottom metal structure and the first top metal structure, and the second signal via structure is electrically coupled to the second bottom metal structure and the second top metal structure.

17. The apparatus of claim 1 wherein the bottom substrate is a multi-layer substrate.

18. The apparatus of claim 1 wherein the top substrate is a multi-layer substrate.

19. A method comprising:
providing a bottom package precursor, which comprises a bottom substrate and a bottom electronic component, wherein:
the bottom substrate comprises a bottom substrate body having an upper side and a lower side, at least one bottom metal structure on the upper side of the bottom substrate body, and at least one bottom thermally conductive structure that extends from the upper side of the bottom substrate body through the bottom substrate body to the lower side of the bottom substrate body; and
the bottom electronic component is mounted on the upper side of the bottom substrate body, wherein the at least one bottom thermally conductive structure is thermally coupled to the bottom electronic component and conducts heat generated from the bottom electronic component toward the lower side of the bottom substrate body;
providing a top package precursor, which comprises a top substrate and a top electronic component, wherein:
the top substrate comprises a top substrate body having an upper side and a lower side, at least one top metal structure on the lower side of the top substrate body, and at least one top thermally conductive structure that extends from the upper side of the top substrate body through the top substrate body to the lower side of the top substrate body; and
the top electronic component is mounted on the lower side of the top substrate body, wherein the at least one top thermally conductive structure is thermally coupled to the top electronic component and conducts heat generated from the top electronic component toward the upper side of the top substrate body;
providing a perimeter wall, which comprises at least one signal via structure extending from an upper surface of the perimeter wall through the perimeter wall to a lower surface of the perimeter wall; and
assembling the bottom package precursor, the perimeter wall, and the top package precursor, wherein:
the perimeter wall extends from a periphery of the lower side of the top substrate body to a periphery of the upper side of the bottom substrate body such that a cavity is defined by a portion of the upper side of the bottom substrate body, an inside surface of the perimeter wall, and a portion of the lower side of the top substrate body;
the bottom electronic component and the top electronic component are exposed to the cavity; and
the at least one signal via structure is electrically coupled to the at least one bottom metal structure and the at least one top metal structure.

20. The method of claim 19 further comprising applying a sealing material to an exterior portion of a top junction, which is formed between the upper surface of the perimeter wall and the lower side of the top substrate body, and an exterior portion of a bottom junction, which is formed between the lower surface of the perimeter wall and the upper side of the bottom substrate body.

21. The apparatus of claim 19 wherein the bottom substrate further comprises a bottom signal via extending from the upper side of the bottom substrate body through the bottom substrate body to the lower side of the bottom substrate body, wherein the bottom signal via is electrically coupled to the at least one bottom metal structure and separated from the at least one bottom thermally conductive structure.

* * * * *